(12) United States Patent
Chen et al.

(10) Patent No.: US 11,335,797 B2
(45) Date of Patent: May 17, 2022

(54) SEMICONDUCTOR DEVICES AND METHODS FOR FABRICATING THE SAME

(71) Applicant: Vanguard International Semiconductor Corporation, Hsinchu (TW)

(72) Inventors: Chih-Yen Chen, Tainan (TW); Chang-Xiang Hung, Budai Township, Chiayi County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 110 days.

(21) Appl. No.: 16/387,063

(22) Filed: Apr. 17, 2019

(65) Prior Publication Data

US 2020/0335616 A1    Oct. 22, 2020

(51) Int. Cl.
*H01L 29/778* (2006.01)
*H01L 29/20* (2006.01)
(Continued)

(52) U.S. Cl.
CPC ...... *H01L 29/7786* (2013.01); *H01L 21/0254* (2013.01); *H01L 29/1033* (2013.01); *H01L 29/2003* (2013.01); *H01L 29/66462* (2013.01)

(58) Field of Classification Search
CPC ........... H01L 29/7786; H01L 29/66462; H01L 29/432
See application file for complete search history.

(56) References Cited

U.S. PATENT DOCUMENTS

2013/0271208 A1* 10/2013 Then ............... H01L 25/072
                                                       438/270
2017/0092752 A1*  3/2017 Lu ................ H01L 29/66462
(Continued)

FOREIGN PATENT DOCUMENTS

TW    201405823 A    2/2014
TW    201714307 A    4/2017
TW    201901750 A    1/2019

OTHER PUBLICATIONS

Taiwanese Office Action and Search Report, dated May 18, 2020, for Taiwanese Application No. 108105377.

*Primary Examiner* — Moazzam Hossain
*Assistant Examiner* — Hajar Kolahdouzan
(74) *Attorney, Agent, or Firm* — Birch, Stewart, Kolasch & Birch, LLP

(57) ABSTRACT

A semiconductor device is provided. The semiconductor device includes a channel layer disposed on a substrate, a barrier layer disposed on the channel layer, and a nitride layer disposed on the barrier layer. The semiconductor device also includes a compound semiconductor layer that includes an upper portion and a lower portion, wherein the lower portion penetrates through the nitride layer and a portion of the barrier layer. The semiconductor device also includes a spacer layer conformally disposed on a portion of the barrier layer and extending onto the nitride layer. The semiconductor device further includes a gate electrode disposed on the compound semiconductor layer, and a pair of source/drain electrodes disposed on opposite sides of the gate electrode. The pair of source/drain electrodes extends through the spacer layer, the nitride layer, and at least a portion of the barrier layer.

23 Claims, 6 Drawing Sheets

(51) Int. Cl.
*H01L 21/02* (2006.01)
*H01L 29/10* (2006.01)
*H01L 29/66* (2006.01)

(56) References Cited

U.S. PATENT DOCUMENTS

2017/0345922 A1\* 11/2017 Iucolano ............ H01L 21/02458
2018/0308953 A1\* 10/2018 Chiu ................. H01L 29/66462

\* cited by examiner

SEMICONDUCTOR DEVICES AND METHODS FOR FABRICATING THE SAME

BACKGROUND

Technical Field

The embodiment of the present disclosure relates to semiconductor devices, and in particular it relates to high electron mobility transistors and methods for fabricating the same.

Description of the Related Art

A high electron mobility transistor (HEMT), also known as a heterostructure field-effect transistor (HFET) or a modulation-doped field-effect transistor (MODFET), is a type of field effect transistor (FET) formed of semiconductor materials having different energy gaps. A two-dimensional electron gas (2DEG) layer is formed at the interface between two different semiconductor materials that are adjacent to each other. Due to the high electron mobility of the two-dimensional electron gas, the high electron mobility transistor can have the benefits of high breakdown voltage, high electron mobility, low on-resistance, and low input capacitance, and is therefore suitable for high-power components.

When designing a high electron mobility transistor, the main considerations are low on-resistance ($R_{on}$) and high threshold voltage ($V_{th}$). However, the two-dimensional electron gas of the GaN-based high electron mobility transistor does not need doping. The main sources of the carriers are from the surface state and unintentional doping. The carriers are essentially the free carriers caused by defects. Therefore, the two-dimensional electron gas of the GaN-based high electron mobility transistor is very sensitive to variations in the electric field, and dispersion may occur during the switching operation.

Although existing GaN-based high electron mobility transistors have been adequate for their intended purposes, they have not been entirely satisfactory in all respects. Therefore, how to effectively reduce the impact of dispersion on the device's performance is the focus of the current technical development.

BRIEF SUMMARY OF THE DISCLOSURE

Some embodiments of the disclosure provide a semiconductor device. The semiconductor device includes a channel layer disposed on a substrate, a barrier layer disposed on the channel layer, and a nitride layer disposed on the barrier layer. The semiconductor device also includes a compound semiconductor layer that includes an upper portion and a lower portion, wherein the lower portion penetrates through the nitride layer and a portion of the barrier layer. The semiconductor device also includes a spacer layer conformally disposed on a portion of the barrier layer and extending onto the nitride layer. The semiconductor device further includes a gate electrode disposed on the compound semiconductor layer, and a pair of source/drain electrodes disposed on opposite sides of the gate electrode. The pair of source/drain electrodes extends through the spacer layer, the nitride layer, and at least a portion of the barrier layer.

Some embodiments of the disclosure provide a method for fabricating a semiconductor device. The method includes forming a channel layer on a substrate, forming a barrier layer on the channel layer, forming a nitride layer on the barrier layer, and recessing the nitride layer and the barrier layer to form a recess, wherein the recess penetrates through the nitride layer and a portion of the barrier layer. The method also includes conformally forming a spacer layer on the nitride layer and in the recess, forming a compound semiconductor layer on the spacer layer, wherein the compound semiconductor layer comprises an upper portion and a lower portion, wherein the lower portion fills the recess. The method further includes forming a gate electrode on the compound semiconductor layer, and forming a pair of source/drain electrodes on opposite sides of the gate electrode. The pair of source/drain electrodes extends through the spacer layer, the nitride layer, and at least a portion of the barrier layer.

A detailed description is given in the following embodiments with reference to the accompanying drawings.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
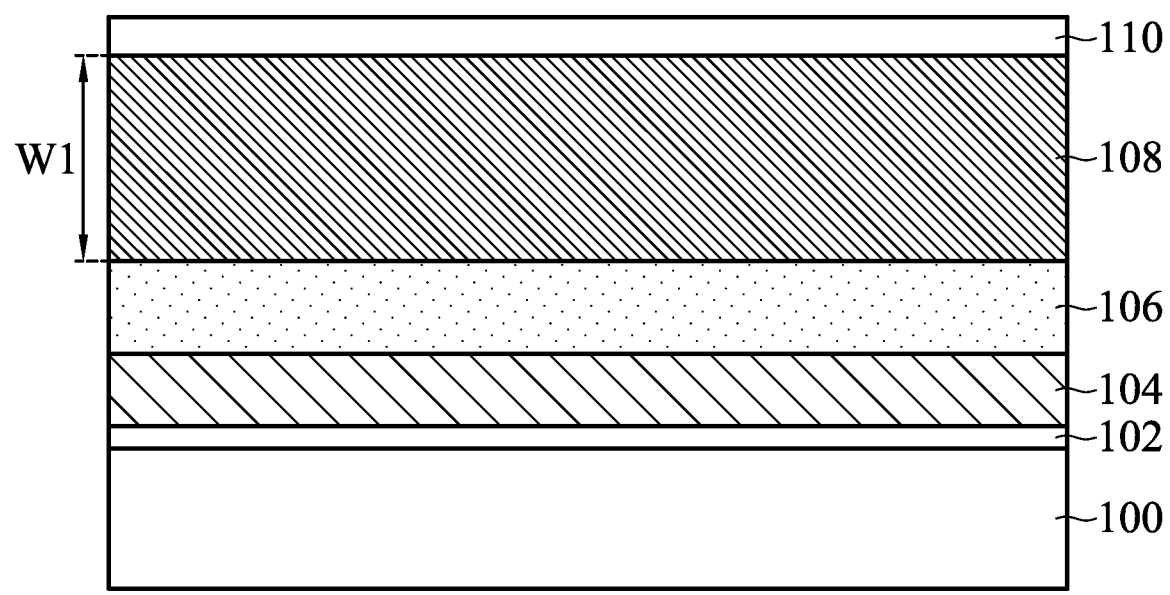
FIGS. 1 to 5 are cross-sectional views illustrating intermediate stages of an example method for forming the semiconductor device of FIG. 6 in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The terms "about", "approximately", and "substantially" used herein generally refer to a value of an error or a range within 40 percent, preferably within 20 percent, and more preferably within 10 percent, within 5 percent, within 3 percent, within 2 percent, or within 1 percent. If there is no specific description, the mentioned values are regarded as an approximation that is the error or the range expressed as "about", "approximate", or "substantially".

Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

Embodiments of semiconductor device and methods for fabricating the same are provided, especially suited for a high electron mobility transistor (HEMT). In some embodiments of the present disclosure, by disposing a nitride layer and a spacer layer on a barrier layer, and cutting off the nitride layer and the spacer layer at a position of a gate region to form a recess, the dispersion problem of the semiconductor device may be solved. Furthermore, the thickness of the barrier layer other than the gate region may be made thicker to reduce the on-resistance ($R_{on}$), and the gate doping may be decreased without decreasing the threshold voltage. As a result, the tripartite trade-off deadlock of the on-resistance ($R_{on}$), the threshold voltage ($V_{th}$), and the dispersion may be eliminated.

Figure 4:
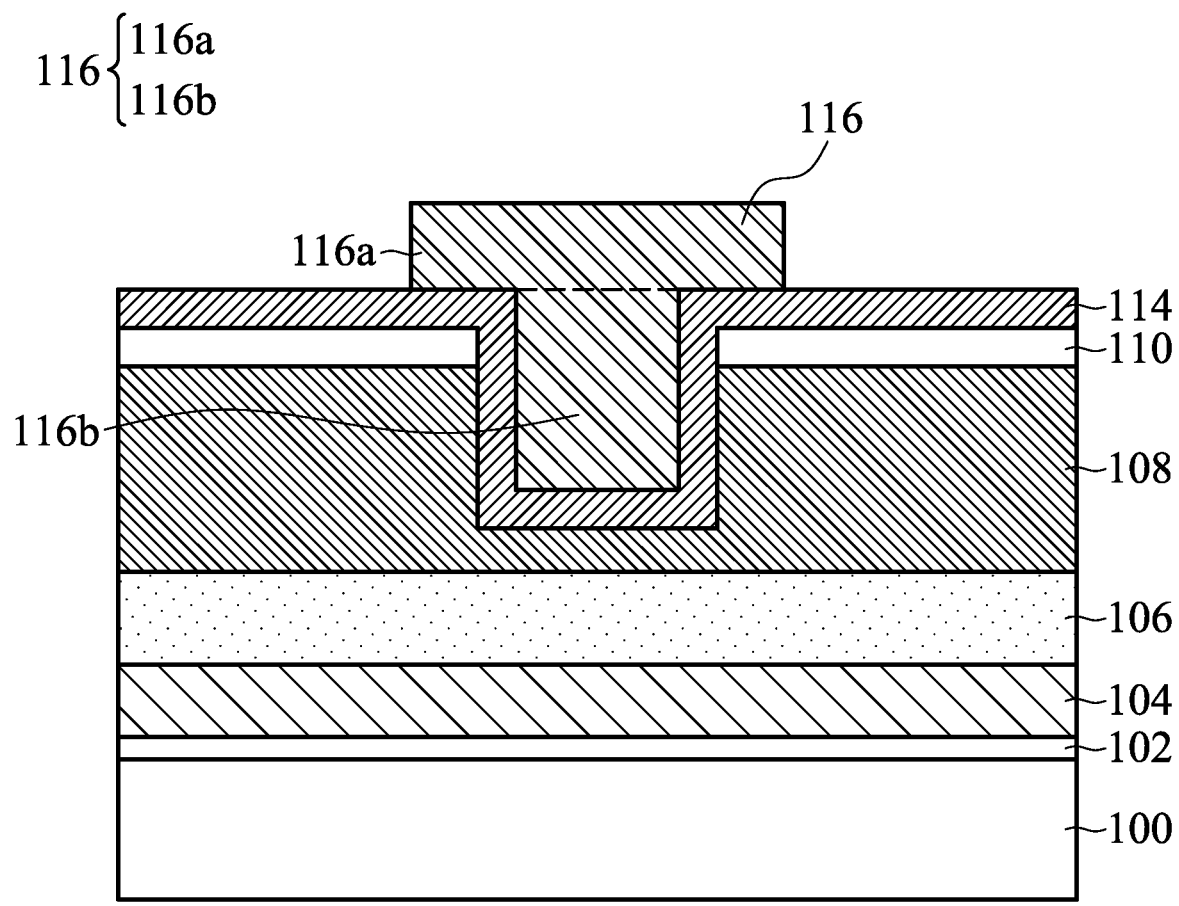
Figure 5:
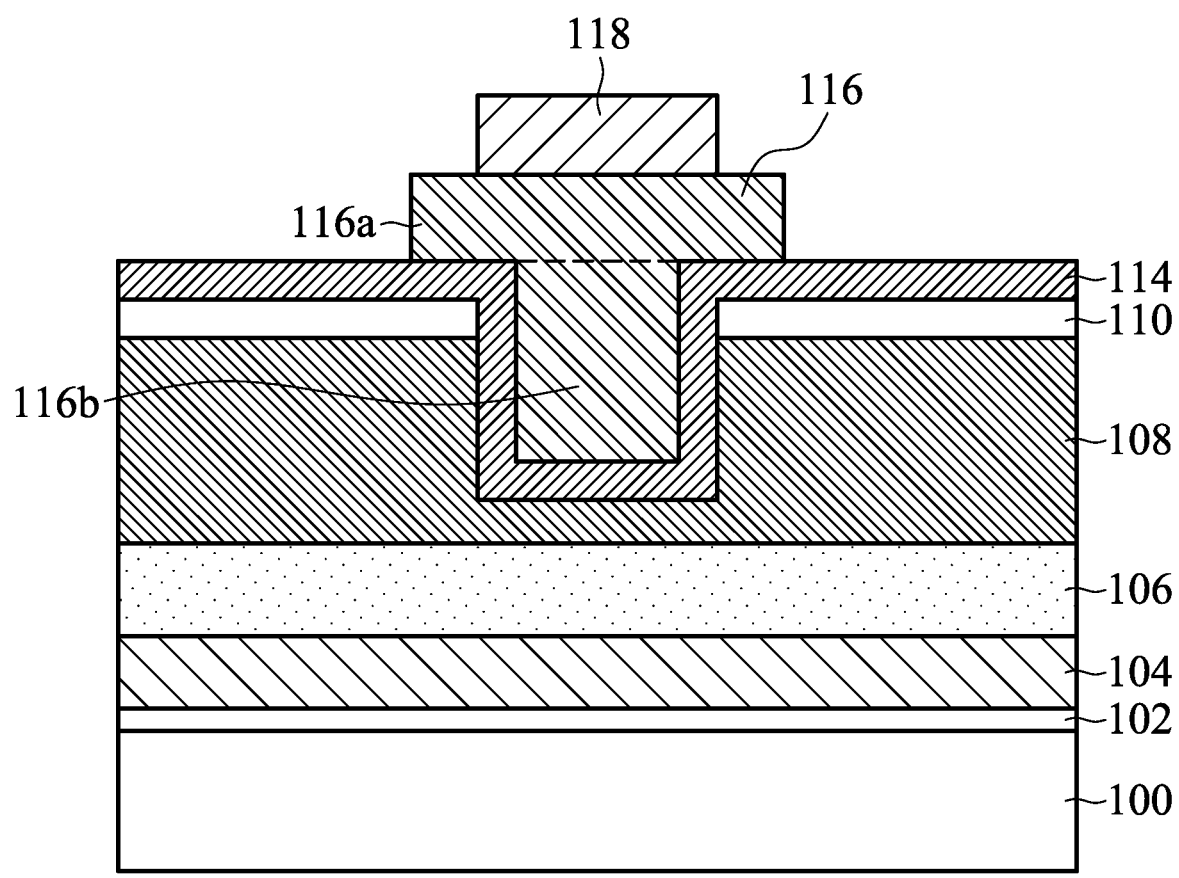
Figure 6:
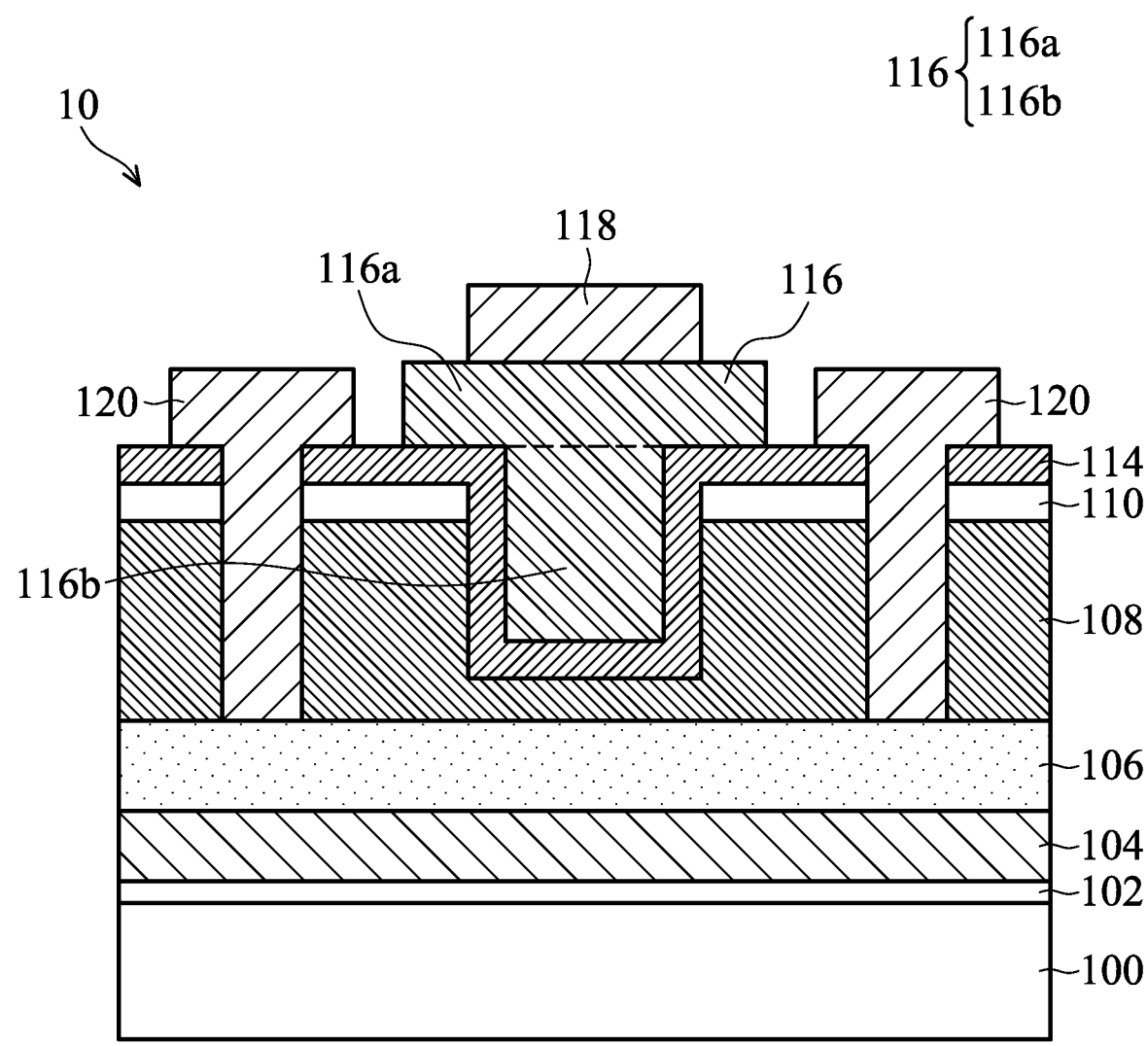
FIG. 6 is a cross-sectional view of a semiconductor device in accordance with an embodiment of the present disclosure.

FIGS. 1 to 5 are cross-sectional views illustrating intermediate stages of an exemplary method for forming the semiconductor device 10 of FIG. 6 in accordance with some embodiments. FIG. 6 is a cross-sectional view of a semiconductor device in accordance with an embodiment of the present disclosure.

FIG. 1 illustrates an initial step of a method for forming the semiconductor device 10 according to an embodiment of the present disclosure. As shown in FIG. 1, a substrate 100 is provided. Next, a buffer layer 104 is formed on the substrate 100, a channel layer 106 is formed on the buffer layer 104, and a barrier layer 108 is formed on the channel layer 106. In some embodiments, a nucleation layer 102 may be formed between the substrate 100 and the buffer layer 104, as shown in FIG. 1.

The substrate 100 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a silicon oxide layer, a silicon nitride layer, a polysilicon layer, or a stacked combination thereof. Other substrates, such as a multi-layered or gradient substrate may also be used. In some embodiments, the semiconductor material of the semiconductor substrate may include silicon with different crystal planes, including Si (111) or Si (110). In some embodiments, the substrate 100 may be a semiconductor substrate or a ceramic substrate, such as a gallium nitride (GaN) substrate, a silicon carbide (SiC) substrate, an aluminum nitride (AlN) substrate, or a sapphire substrate.

The nucleation layer 102 may relieve the lattice mismatch between the substrate 100 and layers grown thereon and improve the crystalline quality. The nucleation layer 102 is optional. In some embodiments, the materials of the nucleation layer 102 may be or include aluminum nitride (AlN), aluminum gallium nitride (AlGaN), another applicable material, or a combination thereof. For example, the thickness of the nucleation layer 102 may range from about 1 nanometer (nm) to about 500 nm, such as about 200 nm. In some embodiments, the nucleation layer 102 may be formed by a deposition process, such as metal organic chemical vapor deposition (MOCVD), atomic layer deposition (ALD), molecular beam epitaxy (MBE), liquid phase epitaxy (LPE), another applicable process, or a combination thereof.

The buffer layer 104 may be helpful in mitigating a strain of the channel layer 106 which is subsequently formed on the buffer layer 104, and to prevent defects from forming in the overlying channel layer 106. The strain is caused by a mismatch between the channel layer 106 and the substrate 100. In other embodiments, as mentioned above, the buffer layer 104 may be formed directly on the substrate without the nucleation layer 102, to simplify the process steps, and the performance may be improved as well. In some embodiments, the materials of the buffer layer 104 may include a Group III-V compound semiconductor material, such as a Group III nitride. For example, the materials of the buffer layer 104 may include gallium nitride (GaN), aluminum nitride (AlN), aluminum gallium nitride (AlGaN), aluminum indium nitride (AlInN), another applicable material, or a combination thereof. For example, the thickness of the buffer layer 104 may range from about 500 nm to about 50000 nm. In some embodiments, the buffer layer 104 may be formed by a deposition process, such as metal organic chemical vapor deposition (MOCVD), atomic layer deposition (ALD), molecular beam epitaxy (MBE), liquid phase epitaxy (LPE), another applicable process, or a combination thereof.

The piezoelectric polarization effect induced by the different lattice constant of the channel layer 106 and the barrier layer 108, and the spontaneous polarization of the channel layer 106 and the barrier layer 108 may form the two-dimensional electron gas (2DEG, not shown) at a heterogeneous interface between the channel layer 106 and the barrier layer 108. The semiconductor device 10 as shown in FIG. 6 is a high electron mobility transistor (HEMT) which utilizes the two-dimensional electron gas as conductive carriers. In some embodiments, the channel layer 106 and the barrier layer 108 may have no dopant therein. In some other embodiments, the channel layer 106 and the barrier layer 108 may be doped, such as with an n-type or a p-type dopant. In a specific embodiment of the present disclosure, the channel layer 106 utilizes the intrinsic unintentional doping as a source of the two-dimensional electron gas. For example, the unintentional doping may be defects, free donors, and the like existing in the background. In some embodiments, the dopant concentration of the unintentional doping ranges from about $5\times10^{16}$ cm$^{-3}$ to about $5\times10^{17}$ cm$^{-3}$.

In some embodiments, the materials of the channel layer 106 may include one or more Group III-V compound semiconductor materials, such as a Group III nitride. For example, the materials of the channel layer 106 may be or include gallium nitride (GaN), aluminum gallium nitride (AlGaN), aluminum indium nitride (AlInN), indium gallium nitride (InGaN), indium aluminum gallium nitride (InAlGaN), another applicable material, or a combination thereof. In some embodiments, the thickness of the channel layer 106 may range from about 0.05 micrometers (μm) to about 1 such as about 0.2 µm. According to some embodiments, the channel layer 106 may be formed by a deposition process, such as metal organic chemical vapor deposition (MOCVD), atomic layer deposition (ALD), molecular beam epitaxy (MBE), liquid phase epitaxy (LPE), another applicable process, or a combination thereof.

In some embodiments, the materials of the barrier layer 108 may include a Group III-V compound semiconductor material, such as a Group III nitride. For example, the barrier layer 108 may be or include aluminum nitride (AlN), aluminum gallium nitride (AlGaN), aluminum indium nitride (AlInN), aluminum gallium indium nitride (AlGaInN), another applicable material, or a combination thereof. The barrier layer 108 may include a single layer or a multilayer structure. The high electron mobility transistor in the embodiment of the present disclosure has a thicker barrier layer as compare to the general high electron mobility transistor, and thus the on-resistance ($R_{on}$) of the device may be significantly reduced. For example, the barrier layer 108 has a maximum thickness W1, and the maximum thickness W1 may range from about 10 nm to about 60 nm, such as about 40 nm. In some embodiments, the barrier layer 108 may be formed by a deposition process, such as metal organic chemical vapor deposition (MOCVD), atomic layer deposition (ALD), molecular beam epitaxy (MBE), liquid phase epitaxy (LPE), another applicable process, or a combination thereof.

Still referring to FIG. 1, a nitride layer 110 is formed on the barrier layer 108. The nitride layer 110 can protect the barrier layer 108 from the oxidation during the subsequent manufacturing process. In addition, the nitride layer 110 may also eliminate the dispersion problem of the device, the details of which will be discussed later. In some embodiments, the materials of the nitride layer 110 may be or include gallium nitride (GaN), aluminum gallium nitride (AlGaN), aluminum indium nitride (AlInN), aluminum gallium indium nitride (AlGaInN), indium gallium nitride (InGaN), another applicable material, or a combination thereof. In some embodiments, the thickness of the nitride layer 110 may range from about 1 nm to about 20 nm, such as about 5 nm. According to some embodiments, the nitride layer 110 may be formed by a deposition process, such as metal organic chemical vapor deposition (MOCVD), atomic layer deposition (ALD), molecular beam epitaxy (MBE), liquid phase epitaxy (LPE), another applicable process, or a combination thereof.

Figure 2:
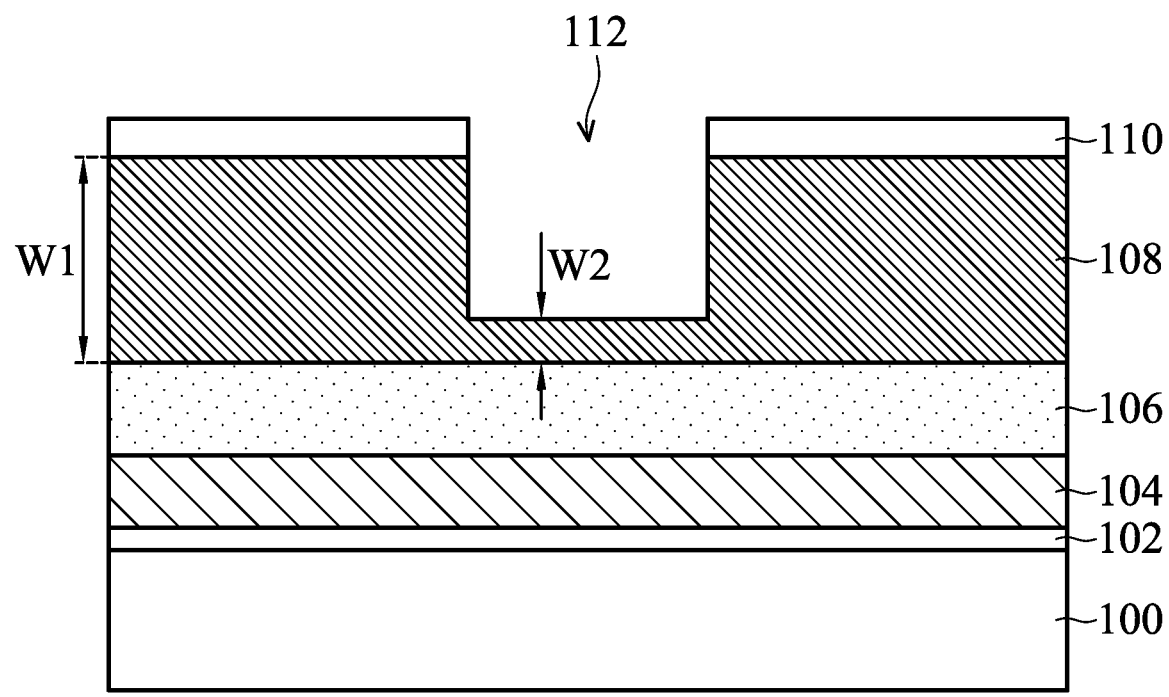

Next, as shown in FIG. 2, the nitride layer 110 and the barrier layer 108 are recessed to form a recess 112, wherein the recess 112 penetrates through the nitride layer 110 and a portion of the barrier layer 108. The recess 112 corresponds to the position of the gate electrode 118 to be formed (not illustrated in FIG. 2 but illustrated and described below with respect to FIG. 5). The portion of the barrier layer 108 under the recess 112 has a reduced thickness W2 due to the formation of the recess 112. The reduced thickness W2 is under the gate electrode 118 to be formed in the subsequent process (not illustrated in FIG. 2 but illustrated and described below with respect to FIG. 5), which has a benefit of increasing the threshold voltage ($V_{th}$) of the device. In some embodiments, the reduced thickness W2 may range from about 5 nm to about 15 nm, such as about 10 nm.

In general, the two-dimensional electron gas of the GaN-based high electron mobility transistor has two main sources, one is the carriers released from the surface state, and the other is the unintentional doping of the channel layer and the source of the two-dimensional electron gas is generally the former due to the heterostructure and the polarization electric field between the barrier layer and the channel layer. Therefore, when the semiconductor device is in an off state, the carriers in the channel layer are confined by the high electric field traction of the surface. When the semiconductor device is switched from the off state to the on state, there is not enough time to release the confined carriers in the channel layer 106 (i.e., the relaxation time is too long), causing decrease of the current, which is so-called the dispersion problem. In the embodiment of the present disclosure, since the nitride layer accommodates most of the free carriers from the surface state, the channel layer underneath the nitride layer must be forced to extract the carriers from the unintentional doping, and therefore the impact of the high electric field in the off state on the channel layer is avoided. In addition, the nitride layer 110 is cut off by the recess 112. Therefore, in the on state, the nitride layer 110 does not participate in the current conduction, so that there is no problem of the dispersion. As a result, instead of the channel layer 116, the nitride layer 110 is used to withstand the high electric field of the surface state, and thus the dispersion problem of the semiconductor device is avoided.

In some embodiments, a patterning process may be used to recess the nitride layer 110 and the barrier layer 108 to form the recess 112. For example, the patterning process may include a lithography process (e.g., photoresist coating, soft baking, mask aligning, exposure, post-exposure baking, developing photoresist, another applicable process, or a combination thereof), an etching process (e.g., a wet etching process, a dry etching process, another applicable process, or a combination thereof), another applicable process, or a combination thereof. In some embodiments, a patterned photoresist layer (not shown) having an opening corresponding to the recess 112 may be formed on the nitride layer 110 by a lithography process, and then an etching process may be performed to remove portions of the nitride layer 110 and the barrier layer 108 exposed by the opening of the patterned photoresist layer (not shown) to form the recess 112 in the nitride layer 110 and the barrier layer 108. Then, the patterned photoresist layer is removed by using an ashing process or a wet strip process.

Figure 3:
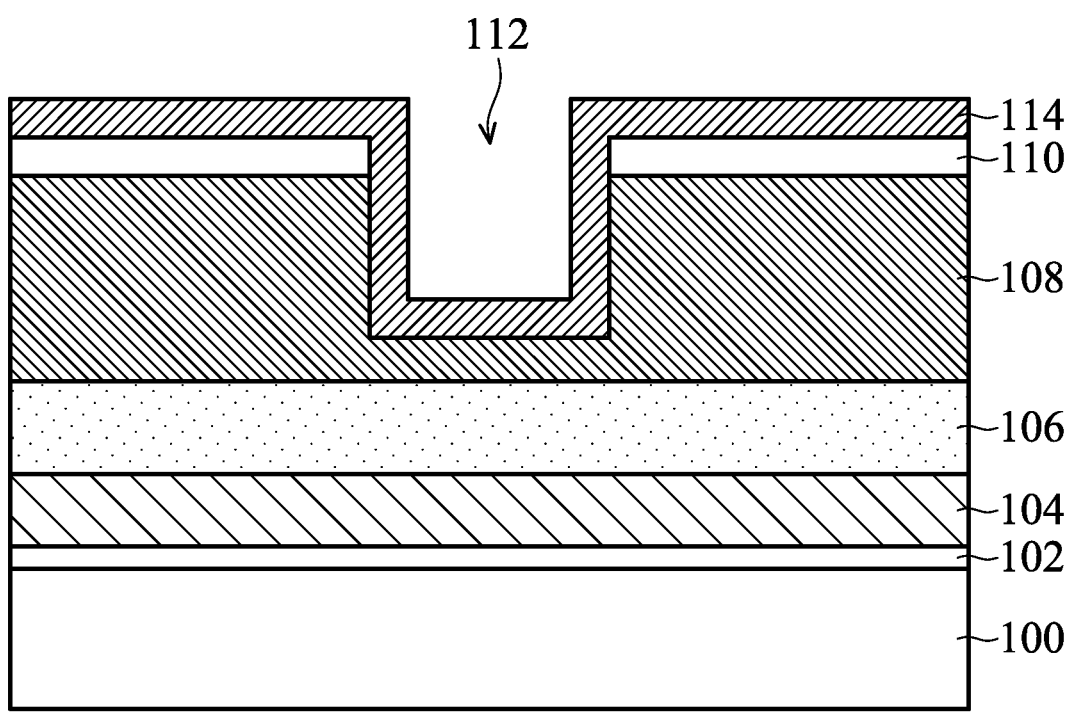

Referring to FIG. 3, a spacer layer 114 is conformally formed on the nitride layer 110 and in the recess 112, and thus the spacer layer 114 is conformally formed along sidewalls and a bottom surface of the recess 112. In some embodiments, the band gap of the spacer layer 114 is larger than the band gap of the compound semiconductor layer 116 to be formed in the subsequent process (not illustrated in FIG. 3 but illustrated and described below with respect to FIG. 5) and the band gap of the nitride layer 110. Therefore, the spacer layer 114 may prevent the dopant in the compound semiconductor layer 116 from diffusing into other components of the semiconductor device 10 to avoid the increase of the on resistance ($R_{on}$) and to reduce the dispersion problem of the device. In addition, during the subsequent etching process for forming the compound semiconductor layer 116, the spacer layer 114 may also serve as an etch stop layer (ESL) to stop the etching process.

The spacer layer 114 may be formed of a material having a different etch selectivity from adjacent layers or components (i.e., the compound semiconductor layer 116). In some embodiments, the spacer layer 114 may be aluminum-containing nitride. For example, the materials of the spacer layer 114 may be or include aluminum nitride (AlN), aluminum gallium nitride (AlGaN), aluminum indium nitride (AlInN), aluminum gallium indium nitride (AlGaInN), another applicable material, or a combination thereof. In a specific embodiment, the spacer layer 114 is aluminum nitride (AlN). Further, in some embodiments, the thickness of the spacer layer 114 may range from about 1 nm to about 7 nm, such as about 2 nm.

FIG. 4 illustrates the formation of the compound semiconductor layer 116. In some embodiments, the compound semiconductor layer 116 is conformally formed on the spacer layer 114, and a lithography process and an etching process are then used to define the pattern of the compound semiconductor layer 116. The compound semiconductor layer 116 includes an upper portion 116a and a lower portion 116b, wherein the portion of the compound semiconductor layer 116 filled in the recess 112 is defined as the lower portion 116b of the compound semiconductor layer 116, as shown in FIG. 4. In other words, the compound semiconductor layer 116 corresponds to the position of the gate electrode 118 to be formed (not illustrated in FIG. 4 but illustrated and described below with respect to FIG. 5). The generation of two-dimensional electron gas under the gate electrode 118 can be inhibited by the compound semiconductor layer 116 to attain a normally-off status for the semiconductor device.

In some embodiments, the materials of the compound semiconductor layer 116 may be n-type or p-type doped gallium nitride (GaN). For example, the thickness of the upper portion 116a of the compound semiconductor layer 116 may range from about 5 nm to about 100 nm, such as 60 nm. For example, the thickness of the lower portion 116b of the compound semiconductor layer 116 may range from about 7 nm to about 72 nm, such as 40 nm. In some embodiments, the dopant concentration of the upper portion 116a of the compound semiconductor layer 116 may be different from the dopant concentration of the lower portion 116b of the compound semiconductor layer 116.

In some embodiments, the compound semiconductor layer 116 may be formed by a deposition process and a patterning process. For example, the deposition process may be used to form a deposited material layer on the spacer layer 114, wherein a portion of the deposited material layer fills the recess 112. In some embodiments, the patterning process includes forming a patterned mask layer (not shown) on the deposited material layer, then etching a portion of the deposited material layer that is not covered by the patterned mask layer, and forming the compound semiconductor layer 116.

In some embodiments, the deposition process may include metal organic chemical vapor deposition (MOCVD), atomic layer deposition (ALD), molecular beam epitaxy (MBE), liquid phase epitaxy (LPE), another applicable process, or a combination thereof.

In some embodiments, the patterned mask layer may be a photoresist, such as a positive photoresist or a negative photoresist. In other embodiments, the patterned mask layer may be a hard mask, such as silicon oxide, silicon nitride, silicon oxynitride, silicon carbide, silicon carbon nitride, the like, or a combination thereof. In some embodiments, the patterned mask layer may be formed by spin-on coating, physical vapor deposition (PVD), chemical vapor deposition (CVD), another applicable process, or a combination thereof.

In some embodiments, the deposited material layer may be etched by using a dry etch process, a wet etch process, or a combination thereof. For example, the deposited material layer may be etched by reactive ion etching (RIE), inductively-coupled plasma (ICP) etching, neutral beam etching (NBE), electron cyclotron resonance (ERC) etching, another applicable process, or a combination thereof.

In some embodiments, the upper portion 116a of the compound semiconductor layer 116 may extend onto a surface of the spacer 114 that is outside the recess, that is, the compound semiconductor layer 116 has a T-shaped in the cross-sectional view, as shown in FIG. 4. In other embodiments, the upper portion 116a of the compound semiconductor layer 116 does not extend onto a surface of the spacer 114 that is outside the recess, then the compound semiconductor layer 116 has a rectangular shaped in the cross-sectional view (not shown). In some embodiment, an upper surface of the compound semiconductor layer 116 may be uneven. In some embodiment, a length of the upper portion 116a of the compound semiconductor layer 116 extending onto the surface of the spacer 114 may be asymmetry.

In some embodiments, the formation of the compound semiconductor layer 116 further includes being doped with a dopant to increase the threshold voltage ($V_{th}$). For example, for the compound semiconductor layer 116 is a p-type doped GaN, the dopant may include magnesium (Mg). Generally, during the manufacture of the semiconductor device 10, heat treatment is usually performed several times, so that the dopant thermal diffuses out of the compound semiconductor layer 116 and into other components and therefore affects the performance of the semiconductor device 10, for example, increasing the on-resistance ($R_{on}$) and causing the dispersion problem of the device. However, in the embodiment of the present disclosure, since the compound semiconductor layer 116 is separated from other components by the spacer layer 114, the dopant of the compound semiconductor layer 116 may be prevented from thermal diffusing into other components. As a result, the increase of the on-resistance ($R_{on}$) and the dispersion problem of the device may be avoided, and the performance of the semiconductor device 10 is improved.

In addition, in the embodiment of the present disclosure, the barrier layer 108 has the reduced thickness W2 (see FIG. 5) under the position of the gate electrode 118 to be formed, the reduced thickness W2 has a benefit of increasing the threshold voltage ($V_{th}$) of the device. In other words, the compound semiconductor layer 116 can be doped with a smaller doping concentration at the same threshold voltage ($V_{th}$). This decreases the impact of the dopant thermally diffusing into other components, and has a benefit of reducing the dispersion problem of the device.

Referring to FIG. 5, the gate electrode 118 is formed on the compound semiconductor layer 116. In some embodiments, the materials of the gate electrode 118 may be or include a conductive material, such as a metal material, a metal silicide, a semiconductor material, or a combination thereof. For example, the metal material may be gold (Au), nickel (Ni), platinum (Pt), palladium (Pd), iridium (Ir), titanium (Ti), chromium (Cr), tungsten (W), aluminum (Al), copper (Cu), the like, a combination thereof, or multilayers thereof. The semiconductor material may be a polysilicon or a poly-germanium. In some embodiments, the steps of forming the gate electrode 118 may include globally depositing a conductive material layer (not shown) for the gate electrode 118 over the substrate 100, and performing a patterning process on the conductive material layer to form the gate electrode 118 on the compound semiconductor layer 116. The deposition process for forming the conductive material layer may be atomic layer deposition (ALD), chemical vapor deposition (CVD), physical vapor deposition (PVD) such as sputtering, a combination thereof, or the like.

Next, referring to FIG. 6, a pair of source/drain electrodes 120 is disposed on opposite sides of the gate electrode 118, wherein the pair of source/drain electrodes 120 extends through the spacer layer 114, the nitride layer 110, and at least a portion of the barrier layer 108. In some embodiments, the pair of source/drain electrodes 120 may be formed by performing a patterning process to recess the spacer layer 114, the nitride layer 110, and a portion of the barrier layer 108 on the opposite sides of the compound semiconductor layer 116 to form a pair of recesses, wherein the pair of the recesses pass through the spacer layer 114 and the nitride layer 110, and extends to the barrier layer 108. Then a conductive material is deposited over the pair of recesses, and the patterned process is performed on the deposited conductive material to form the pair of source/drain electrodes 120 at a predetermined location. The deposition process and the materials of the pair of source/drain electrodes 120 may be similar to the deposition process and the materials of the gate electrode 118, and therefore are not repeated here.

In the embodiment illustrated in FIG. 6, the pair of source/drain electrodes 120 is on the spacer layer 114, passing through the spacer layer 114 and the nitride layer 110, and extending to the barrier layer 108, but the present disclosure is not limited thereto. The depth of the pair of source/drain electrodes 120 may be adjusted depending on the required characteristics of the actual product. For example, the pair of source/drain electrodes 120 may also pass through the barrier layer 108 and extend into the channel layer 106.

The pair of source/drain electrodes 120 and the gate electrode 118 are formed in the different steps as described herein, but the present disclosure is not limited thereto. For example, recesses for the pair of source/drain electrodes 120 may be formed before the formation of the gate electrode 118, and then a deposition process and a patterning process are performed to form the pair of source/drain electrodes 120 and the gate electrode 118 at the same time. In addition, the pair of source/drain electrodes 120 and the gate electrode 118 may be formed independently by the same or different processes and materials. Furthermore, the shape of the pair of source/drain electrodes 120 and the gate electrode 118 are not limited to the vertical sidewalls as illustrated in the figures, and may have inclined sidewalls or another shape.

As shown in FIG. 6, the semiconductor device 10 includes the channel layer 106 disposed on the substrate 100, the barrier layer 108 disposed on the channel layer 106, and the nitride layer 110 disposed on the barrier layer 108. In some embodiments, the barrier layer 108 has the maximum thickness W1 ranging from about 10 nm to about 60 nm. The semiconductor device 10 has a thicker barrier layer as compare to the general high electron mobility transistor, and thus the on-resistance ($R_{on}$) may be significantly reduced. In addition, instead of the channel layer 116, the nitride layer 110 may be used to withstand the high electric field of the surface state, and thus the dispersion problem of the semiconductor device 10 is avoided.

The semiconductor device 10 also includes the compound semiconductor layer 116 including the upper portion 116a and the lower portion 116b, wherein the lower portion 116b penetrates through the nitride layer 110 and a portion of the barrier layer 108. In addition, the semiconductor device 10 also includes the spacer layer 114 conformally disposed on a portion of the barrier layer 108 and extending on the nitride layer 110. The spacer layer 114 may prevent the dopant in the compound semiconductor layer 116 from diffusing into other components of the semiconductor device 10 to avoid the increase of the on resistance ($R_{on}$) and to reduce the dispersion problem of the device, and thus the performance of the semiconductor device 10 is improved.

The semiconductor device 10 further includes the gate electrode 118 disposed on the compound semiconductor layer 116, and the pair of source/drain electrodes 120 disposed on opposite sides of the gate electrode 118. The pair of source/drain electrodes 120 extends through the spacer layer 114, the nitride layer 110, and at least a portion of the barrier layer 108. The barrier layer 108 has the reduced thickness W2 (see FIG. 5) under the gate electrode 118, the reduced thickness W2 has a benefit of increasing the threshold voltage ($V_{th}$) of the semiconductor device 10. In other words, the compound semiconductor layer 116 can be doped with a smaller doping concentration at the same threshold voltage ($V_{th}$). This decreases the impact of the dopant thermally diffusing into other components, and has a benefit of reducing the dispersion problem of the device. In some embodiments, the reduced thickness W2 ranges from about 5 nm to about 15 nm.

In some embodiments, the semiconductor device 10 further includes the buffer layer 104 between the substrate 100 and the channel layer 106. The buffer layer 104 may be helpful in mitigating a strain of the channel layer 106 which is subsequently formed on the buffer layer 104, and to prevent defects from forming in the overlying channel layer 106.

In summary, the semiconductor device according to embodiments of the present disclosure includes the nitride layer disposed on the barrier layer, and the nitride layer may be used to solve the dispersion problem of the semiconductor device. As a result, the tripartite trade-off deadlock of the on-resistance ($R_{on}$), the threshold voltage ($V_{th}$), and the dispersion may be eliminated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a channel layer disposed on a substrate;
   a barrier layer disposed on the channel layer;
   a nitride layer disposed on the barrier layer;
   a compound semiconductor layer comprising an upper portion and a lower portion, wherein the lower portion penetrates physically through the nitride layer and a portion of the barrier layer;
   a spacer layer conformally disposed on a portion of the barrier layer and extending onto the nitride layer, wherein the spacer continuously extends between a bottom surface of the compound semiconductor layer and the barrier, and the spacer is in contact with a top surface of the barrier layer;
   a gate electrode disposed on the compound semiconductor layer; and
   a pair of source/drain electrodes disposed on opposite sides of the gate electrode, wherein the pair of source/drain electrodes extends through the spacer layer, the nitride layer, and at least a portion of the barrier layer.

2. The semiconductor device of claim 1, wherein the nitride layer comprises gallium nitride (GaN), aluminum gallium nitride (AlGaN), aluminum indium nitride (AlInN), aluminum gallium indium nitride (AlGaInN), indium gallium nitride (InGaN), or a combination thereof.

3. The semiconductor device of claim 1, wherein a thickness of the nitride layer ranges from about 1 nm to about 20 nm.

4. The semiconductor device of claim 1, wherein a bandgap of the nitride layer is larger than a bandgap of the compound semiconductor layer and a bandgap of the spacer layer.

5. The semiconductor device of claim 4, wherein the spacer layer comprises aluminum nitride (AlN), aluminum gallium nitride (AlGaN), aluminum indium nitride (AlInN), aluminum gallium indium nitride (AlGaInN), or a combination thereof.

6. The semiconductor device of claim 1, wherein a thickness of the spacer layer ranges from about 1 nm to about 7 nm.

7. The semiconductor device of claim 1, wherein the pair of source/drain electrodes penetrates through the barrier layer and extends to the channel layer.

8. The semiconductor device of claim 1, wherein the barrier layer has a maximum thickness, wherein the maximum thickness ranges from about 10 nm to about 60 nm.

9. The semiconductor device of claim 8, wherein the barrier layer has a thickness under the gate electrode, wherein the thickness ranges from about 5 nm to about 15 nm.

10. The semiconductor device of claim 1, further comprising a buffer layer between the substrate and the channel layer.

11. The semiconductor device of claim 1, wherein the upper portion and the lower portion of the compound semiconductor layer have different dopant concentrations.

12. A method for fabricating the semiconductor device as set forth in claim 1, comprising:
    forming a channel layer on a substrate;
    forming a barrier layer on the channel layer;
    forming a nitride layer on the barrier layer;
    recessing the nitride layer and the barrier layer to form a recess, wherein the recess penetrates through the nitride layer and a portion of the barrier layer;
    conformally forming a spacer layer on the nitride layer and in the recess;
    forming a compound semiconductor layer on the spacer layer, wherein the compound semiconductor layer comprises an upper portion and a lower portion, wherein the lower portion of the compound semiconductor layer fills the recess;
    forming a gate electrode on the compound semiconductor layer; and
    forming a pair of source/drain electrodes on opposite sides of the gate electrode, wherein the pair of source/drain electrodes extends through the spacer layer, the nitride layer, and at least a portion of the barrier layer.

13. The method for fabricating a semiconductor device of claim 12, wherein the nitride layer comprises gallium nitride (GaN), aluminum gallium nitride (AlGaN), aluminum indium nitride (AlInN), aluminum gallium indium nitride (AlGaInN), indium gallium nitride (InGaN), or a combination thereof.

14. The method for fabricating a semiconductor device of claim 12, wherein a thickness of the nitride layer ranges from about 1 nm to about 20 nm.

15. The method for fabricating a semiconductor device of claim 12, wherein a bandgap of the nitride layer is larger than a bandgap of the compound semiconductor layer and a bandgap of the spacer layer.

16. The method for fabricating a semiconductor device of claim 15, wherein the spacer layer comprises aluminum nitride (AlN), aluminum gallium nitride (AlGaN), aluminum indium nitride (AlInN), aluminum gallium indium nitride (AlGaInN), or a combination thereof.

17. The method for fabricating a semiconductor device of claim 12, wherein a thickness of the spacer layer ranges from about 1 nm to about 7 nm.

18. The method for fabricating a semiconductor device of claim 12, wherein the pair of source/drain electrodes penetrates through the barrier layer and extends to the channel layer.

19. The method for fabricating a semiconductor device of claim 12, wherein the barrier layer has a maximum thickness, wherein the maximum thickness ranges from about 10 nm to about 60 nm.

20. The method for fabricating a semiconductor device of claim 19, wherein the barrier layer has a thickness under the gate electrode, wherein the thickness ranges from about 5 nm to about 15 nm.

21. The method for fabricating a semiconductor device of claim 12, further comprising a buffer layer between the substrate and the channel layer.

22. The method for fabricating a semiconductor device of claim 12, wherein the upper portion and the lower portion of the compound semiconductor layer have different dopant concentrations.

23. The semiconductor device of claim 1, wherein the barrier layer has a reduced thickness directly under the lower portion of the compound semiconductor layer.

* * * * *